United States Patent [19]

Butterfield et al.

[11] Patent Number: 4,774,439

[45] Date of Patent: Sep. 27, 1988

[54] HORIZONTAL DEFLECTION STAGE

[75] Inventors: John Butterfield, Wilsden; Stephen Moorhouse, Cullingworth, both of England

[73] Assignee: Microvitec Plc, Bradford, England

[21] Appl. No.: 76,671

[22] Filed: Jul. 23, 1987

[30] Foreign Application Priority Data

Jul. 24, 1986 [GB] United Kingdom ............... 8618140

[51] Int. Cl.⁴ ..................... H01J 29/70; H01J 29/76
[52] U.S. Cl. .................................. 315/408; 358/190
[58] Field of Search ................. 315/411, 371, 408; 358/190

[56] References Cited

U.S. PATENT DOCUMENTS 4,292,654 9/1981 Steckler et al. .................. 358/190
4,645,989 2/1987 Barnes ............................... 315/411

Primary Examiner—Theodore M. Blum
Attorney, Agent, or Firm—Henry Sternberg; Bert J. Lewen

[57] ABSTRACT

A horizontal deflection stage for a raster scan device (e.g. a television receiver or a monitor) comprises a deflection generator, a d.c. supply regulator for the deflection generator, a voltage controlled oscillator providing drive pulses to the deflection generator, a phase detecting circuit for locking the oscillator to applied horizontal synchronizing pulses, and a sweep circuit for sweeping the oscillator through a range of frequencies until it achieves phase and frequency lock with the applied horizontal synchronizing pulses. An input to the regulator serves to control the output voltage of the regulator in accordance with the frequency to which the oscillator is locked. Thus the horizontal deflection stage automatically adjusts the horizontal timebase, and the regulated voltage supply of the deflection generator, in accordance with the frequency of the applied horizontal synchronizing pulses, without any operator adjustment being required.

7 Claims, 1 Drawing Sheet

HORIZONTAL DEFLECTION STAGE

The present invention relates to a horizontal deflection stage for a raster scan display.

It is known to provide a television receiver or a raster-type monitor display with a horizontal deflection stage which includes a deflection-and-flyback generator powered by a regulated d.c. supply and controlled by a processing circuit which generates drive pulses locked in phase and frequency to applied horizontal synchronising pulses. This known horizontal deflection stage usually operates at a discrete scanning frequency: if a different operating frequency is required, the voltage controlled oscillator of the processing circuit requires different timing components to be switched in and a different value of regulated d.c. supply must be switched to the deflection-and-flyback generator.

In accordance with this invention, there is provided a horizontal deflection stage which comprises a deflection generator, a d.c. supply regulator for the deflection generator, a voltage controlled oscillator providing drive pulses to the deflection generator, a phase detecting circuit for locking the oscillator to applied horizontal synchronising pulses, a sweep circuit for sweeping the oscillator through a range of frequencies until it achieves phase and frequency lock with the applied horizontal synchronising pulses, and an input to the regulator serving to control the output voltage of the regulator in accordance with the frequency to which the oscillator is locked.

Thus this horizontal deflection stage automatically adjusts the horizontal timebase, and the regulated voltage supply of the deflection generator, in accordance with the applied horizontal synchronising pulses: no operator adjustment is required.

The sweep circuit for the voltage controlled oscillator may comprise a counter driven by a clock and connected to a digital to analog converter which therefore provides a ramp voltage to the oscillator until, at the appropriate frequency of the oscillator, lock is achieved. In response to this, the counter is stopped. Preferably at the same time a fine adjustment circuit is enabled to trim the counter.

An embodiment of the present invention will now be described by way of example and with reference to the accompanying drawings, in which.

Figure 1:
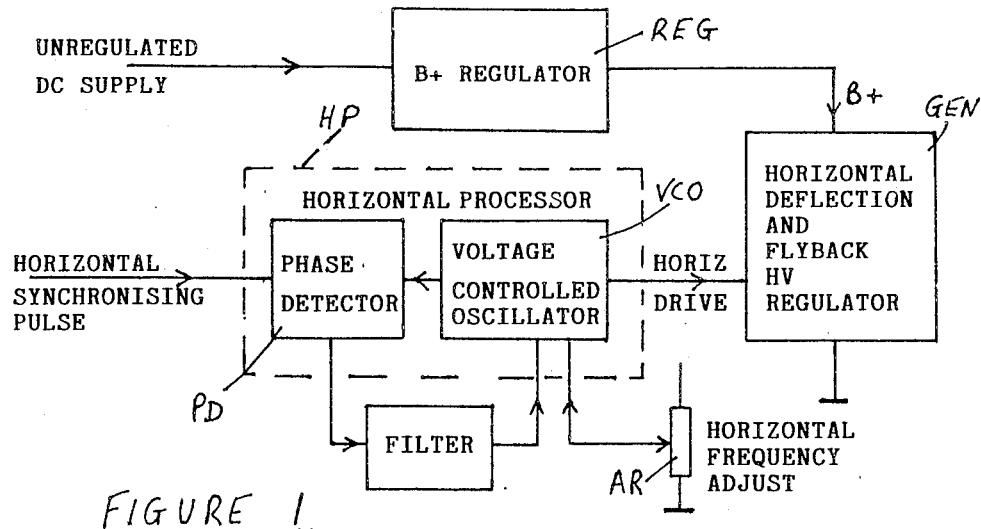
FIG. 1 is a block diagram of a known type of horizontal deflection stage.

Referring to FIG. 1, there is shown a typical known horizontal deflection stage for a television receiver or raster-type monitor display. This comprises a deflection-and-flyback generator GEN operating from a regulated voltage B+ which is derived by a regulator REG from an unregulated d.c. supply. The value of the voltage B+ which is required depends principally upon the value of the inductance of the deflection coil, the scanning energy requirement of the cathode ray tube and deflection coil assembly, and upon the horizontal scanning frequency. The horizontal deflection stage which is shown further comprises a horizontal processor HP which includes a voltage controlled oscillator VCO and a phase detector PD: this processor serves to phase-and frequency-lock the oscillator to horizontal synchronising pulses applied to the phase detector from external hardware. The oscillator VCO provides horizontal drive pulses which are applied to the generator GEN to control the latter. An adjustable resistor AR is provided for adjusting the oscillator VCO to the correct operating frequency, thus compensating for circuit tolerances.

The known horizontal deflection stage shown in FIG. 1 is usually arranged to operate at a discrete horizontal scanning frequency. It can serve for multifrequency operation but this generally involves switching in other timing components for the voltage controlled oscillator VCO and switching a different value of regulated voltage B+ to the deflection-and-flyback generator GEN.

Figure 2:
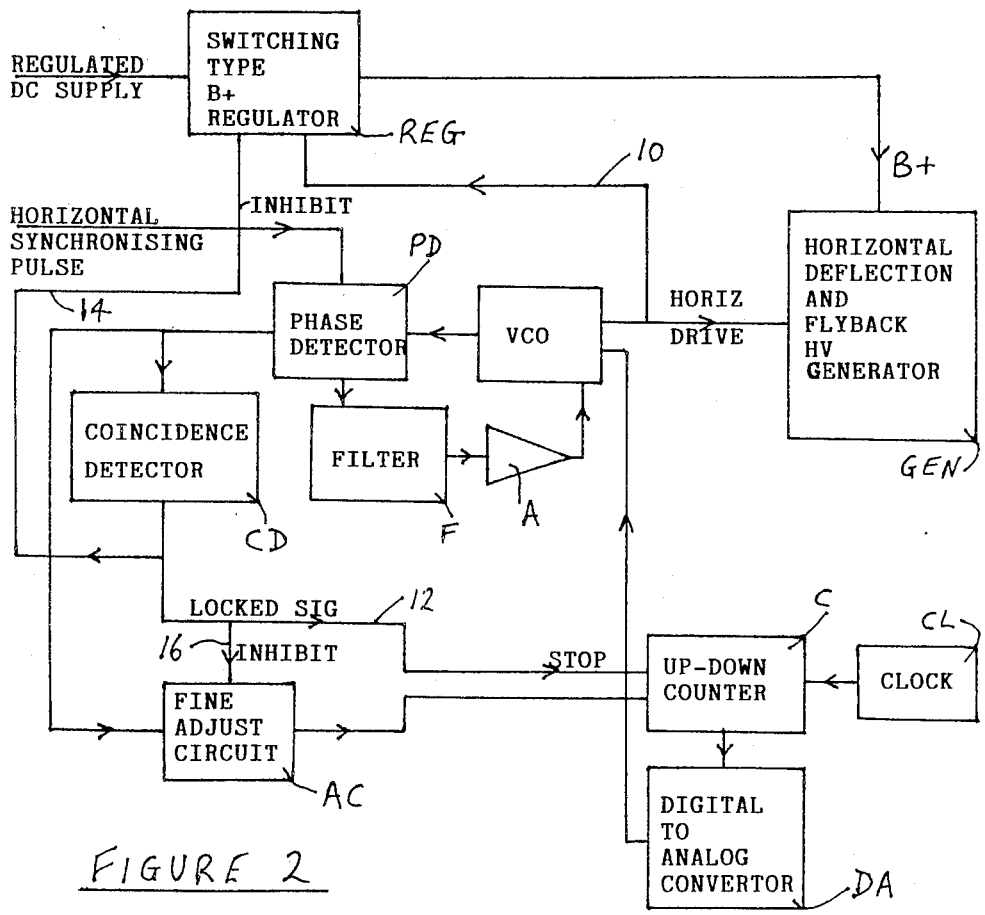
FIG. 2 is a block diagram of a horizontal deflection stage in accordance with this invention.

Referring to FIG. 2, there is shown a horizontal deflection stage in accordance with this invention, in which the horizontal scanning frequency is continuously variable over a range. In a prototype which we have built, the horizontal scanning frequency was continuously variable between 14 kHz and 36 kHz but any desired range can in principle be achieved.

The horizontal deflection stage shown in FIG. 2 comprises a deflection-and-flyback generator GEN powered by a voltage B+ derived from an unregulated d.c. supply by a switching type of regulator REG. A voltage controlled oscillator VCO provides horizontal drive pulses to the generator GEN: a phase detector PD is connected to the oscillator VCO and receives horizontal synchronising pulses from external circuitry and applies an output to the oscillator VCO via a filter F and amplifier A. The oscillator VCO is controlled via a digital to analog converter DA by a counter C which is driven by a clock CL. The regulator REG receives horizontal drive pulses from the oscillator VCO over a line 10. A coincidence detector CD is connected to the phase detector PD and serves, as will be described below, to apply a "stop" signal to the counter C over line 12 when the phase coincidence is detected, and also to remove an "inhibit" signal from the regulator REG over line 14 and from a fine adjustment circuit AC over line 16. The fine adjustment circuit has an input connected to the phase detector PD and an output connected for driving the counter C.

Suppose the horizontal deflection stage shown in FIG. 2 is in an unsynchronised condition with the horizontal synchronising pulses applied. The counter C is continuously clocked and a ramp voltage appears at the output of the digital to analog converter: this ramp voltage is applied to the voltage controlled oscillator to sweep the latter through a range of frequencies. The sweep frequency is however sufficiently low so that the oscillator VCO will stay in the loop capture frequency range for long enough to enable coincidence to be detected by coincidence detector CD and (in response to this) the counter stopped over line 12. Thus, at the appropriate value of the ramp voltage from the converter DA, the oscillator VCO will coincide with the horizontal synchronising pulses applied to the phase detector PD, and the counter will be stopped to lock the system. Further, the inhibit signal on line 16 is at the same time removed and the fine adjustment circuit AC accordingly enabled to trim the up/down counter C and optimise the ramp voltage for the frequency of the applied horizontal synchronising pulses.

Also when lock is achieved, the inhibit signal on line 14 is removed from the regulator REG and the latter is now driven over line 10 by the drive pulses from the oscillator VCO. The regulator REG is of the type such that its regulated output voltage B+ is proportional to the frequency of the pulses applied over line 10, so that the output voltage B+ is always nominally correct for the particular operating frequency concerned. More particularly, the output voltage Vout of the regulator is given by:

$V_{out} = (T_{on}/TH) \cdot V_{in}$ where Vin is the regulator input voltage, Ton is the "on" time of a switching transistor of the regulator (and is constant through use of a monostable timer), and TH is the periodic duty cycle time of this transistor. Since then the horizontal frequency HF=1/TH, then:

$V_{out} = HF \cdot \text{constant}$ confirming that the output voltage B+ of the regulator is proportional to the operating frequency.

The horizontal deflection stage which has been described with reference to FIG. 2 therefore automatically adjusts the horizontal timebase, and the regulated voltage supply of the deflection and flyback generator, in accordance with the applied horizontal synchronising pulses and no operator adjustment is required.

It will be appreciated that alternative circuit arrangements may be made to achieve the synchronisation with the incoming synchronising pulses. For example, the digital-to-analog converter arrangement may be replaced by a circuit using a monostable to generate a tuning voltage proportional to frequency for the VCO. The circuit can thus drive the VCO to within the captive range of the phase locked loop: any residual error can be compensated by the normal loop feedback circuit.

The horizontal deflection stage which has been described preferably has associated with it a side pincushion correction drive circuit arranged so that constant correction is achieved at all values of the voltage B+ within its range. Side pincushion correction is commonly effected electronically using a vertical rate parabolic modulation. If the correction is achieved by a saturable reactor, the required inductance variation is a fixed percentage of the deflection circuit inductance: thus the system generates the correct amount of side pincushion correction at all frequencies of horizontal scan. However, if the correction is achieved by a voltage driven system (e.g. a diode modulator arrangement or by a vertical rate modulation of the B+ supply), then the parabolic voltage amplitude as a proportion of the B+ supply is variable with horizontal frequency (because B+ is proportional to horizontal frequency). In order then that the side pincushion correction is fixed with frequency, a variable gain amplifier, d.c. controlled, may be employed: the B+ supply is used, appropriately attenuated to control the gain of this amplifier such that the required parabolic voltage tracks as a percentage of the B+ supply. Then no adjustment of the side pincushion correction is necessary as the horizontal frequency is changed.

What is claimed is:

1. A horizontal deflection stage for a raster scan device, comprising a deflection generator, a d.c. supply regulator providing an output voltage for the deflection generator, a voltage controlled oscillator signal providing drive pulses to the deflection generator, a phase detecting circuit for phase and frequency locking of the oscillator signal to applied horizontal synchronizing pulses, a sweep circuit for sweeping the oscillator signal through a range of frequencies until it achieves phase and frequency lock with the applied horizontal synchronising pulses, and an input to the regulator serving to control said ouput voltage of the regulator in accordance with the frequency to which the oscillator signal is locked.

2. A horizontal deflection stage as claimed in claim 1, in which the sweep circuit for the voltage controlled oscillator signal comprises a clock, a counter driven by the clock, and having an output, a digital-to-analog converter connected to said output of the counter to provide a ramp voltage, and the oscillator signal having a control input connected to receive said ramp voltage.

3. A horizontal deflection stage as claimed in claim 2, further comprising a detector for determining phase coincidence of the oscillator signal with the applied horizontal synchronising pulses, to stop said counter.

4. A horizontal deflection stage as claimed in claim 3, comprising a fine adjustment circuit controlled by said co-incidence detector so as, in the event of phase coincidence of the oscillator signal with the applied horizontal synchronising pulses, to trim the counter.

5. A horizontal deflection stage as claimed in claim 4, in which said input to said regulator is provided by the drive pulses from the oscillator signal and the regulator provides its said output voltage as a regulated voltage proportional to the frequency of said drive pulses.

6. A horizontal deflection stage as claimed in claim 1, comprising a side pincushion correction drive circuit controlled in accordance with said output voltage of the regulator so as to provide predetermined side pin-cushion correction for all operating frequencies within said range.

7. A horizontal deflection stage for a raster scan device, comprising a deflection generator, a d.c. supply regulator providing an output voltage for the deflection generator, a voltage controlled oscillator signal providing drive pulses to the deflection generator, a phase detecting circuit for phase and frequency locking of the oscillator signal to applied horizontal synchronizing pulses, a sweep circuit for sweeping the oscillator signal through a range of frequencies until it achieves phase and frequency lock with the applied horizontal synchronising pulses, and an input to the regulator serving to control said output voltage of the regulator in accordance with the frequency to which the oscillator signal is locked, said sweep circuit and input to the regulator forming an automatic horizontal timebase adjustment arrangement which, in dependence upon the applied horizontal synchronising pulses, automatically continuously adjusts for a range of different operating frequencies, and correspondingly automatically continuously adjusts the output voltage for the deflection generator.

* * * * *